United States Patent [19]
Katagiri et al.

[11] Patent Number: 5,338,580
[45] Date of Patent: Aug. 16, 1994

[54] METHOD OF PREPARATION OF FUNCTIONAL DEPOSITED FILM BY MICROWAVE PLASMA CHEMICAL VAPOR DEPOSITION

[75] Inventors: Hiroyuki Katagiri, Shiga; Tetsuya Takei; Toshiyasu Shirasuna, both of Nagahama, all of Japan

[73] Assignee: Canon Kabushiki Kaisha, Tokyo, Japan

[21] Appl. No.: 884,286

[22] Filed: May 13, 1992

Related U.S. Application Data

[63] Continuation of Ser. No. 707,297, May 29, 1991, abandoned, which is a continuation of Ser. No. 435,178, Nov. 13, 1989, abandoned.

[30] Foreign Application Priority Data

Nov. 15, 1988 [JP] Japan .................. 63-286733

[51] Int. Cl.$^5$ ............................................. B05D 3/06
[52] U.S. Cl. ..................... 427/575; 427/578; 427/576; 427/569; 118/723 MW; 118/730
[58] Field of Search ............... 427/575, 569, 578, 576; 118/723, 715, 730, 729, 723 MW

[56] References Cited

U.S. PATENT DOCUMENTS

| | | | |
|---|---|---|---|
| 4,840,139 | 6/1989 | Takei ........................ | 118/723 |
| 4,897,281 | 1/1990 | Arai et al. ................ | 427/39 |
| 4,897,284 | 1/1990 | Arai et al. ................ | 427/9 |
| 4,953,498 | 9/1990 | Hashizume et al. ..... | 118/719 |
| 4,958,591 | 9/1990 | Yamazaki ................. | 118/723 |

FOREIGN PATENT DOCUMENTS 62-47485 3/1987 Japan .
63-62880 3/1988 Japan .

Primary Examiner—Roy V. King
Attorney, Agent, or Firm—Fitzpatrick, Cella, Harper & Scinto

[57] ABSTRACT

There is provided a microwave plasma chemical vapor deposition process for forming a functional deposited film on a surface of a substrate by means of microwave plasma chemical vapor deposition conducted in a substantially enclosed film-forming chamber, said film-forming chamber comprising a circumferential wall having an end portion thereof hermetically provided with a microwave introducing window to which a waveguide extending from a microwave power source is connected, said film-forming chamber having a substantially cylindrical discharge space encircled by said substrate surface, said substrate being supported by substrate working means, said film-forming chamber being provided with means for evacuating said film-forming chamber, comprising: (a) longitudinally providing a gas feed pipe provided with a plurality of gas liberation holes at the center position of said discharge space; (b) radiately supplying against said surface of substrate a raw material gas through said plurality of gas liberation holes of said gas feed pipe while moving said surface of substrate by said substrate working means; (c) maintaining the gaseous pressure of said discharge space at a value of 100 mTorr or less; (d) applying into said discharge space microwave energy through said microwave introducing window to cause microwave glow discharge in said discharge space, whereby a functional deposited film is formed on said surface of substrate.

6 Claims, 8 Drawing Sheets

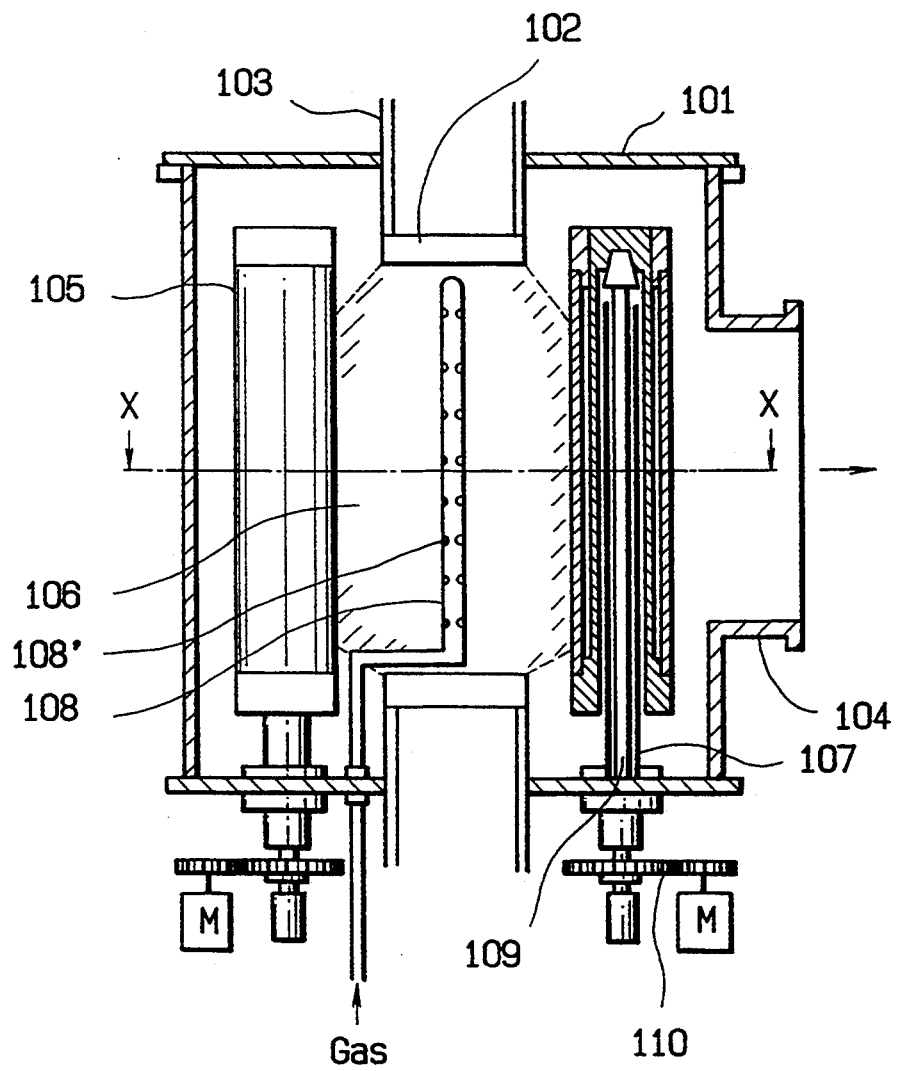

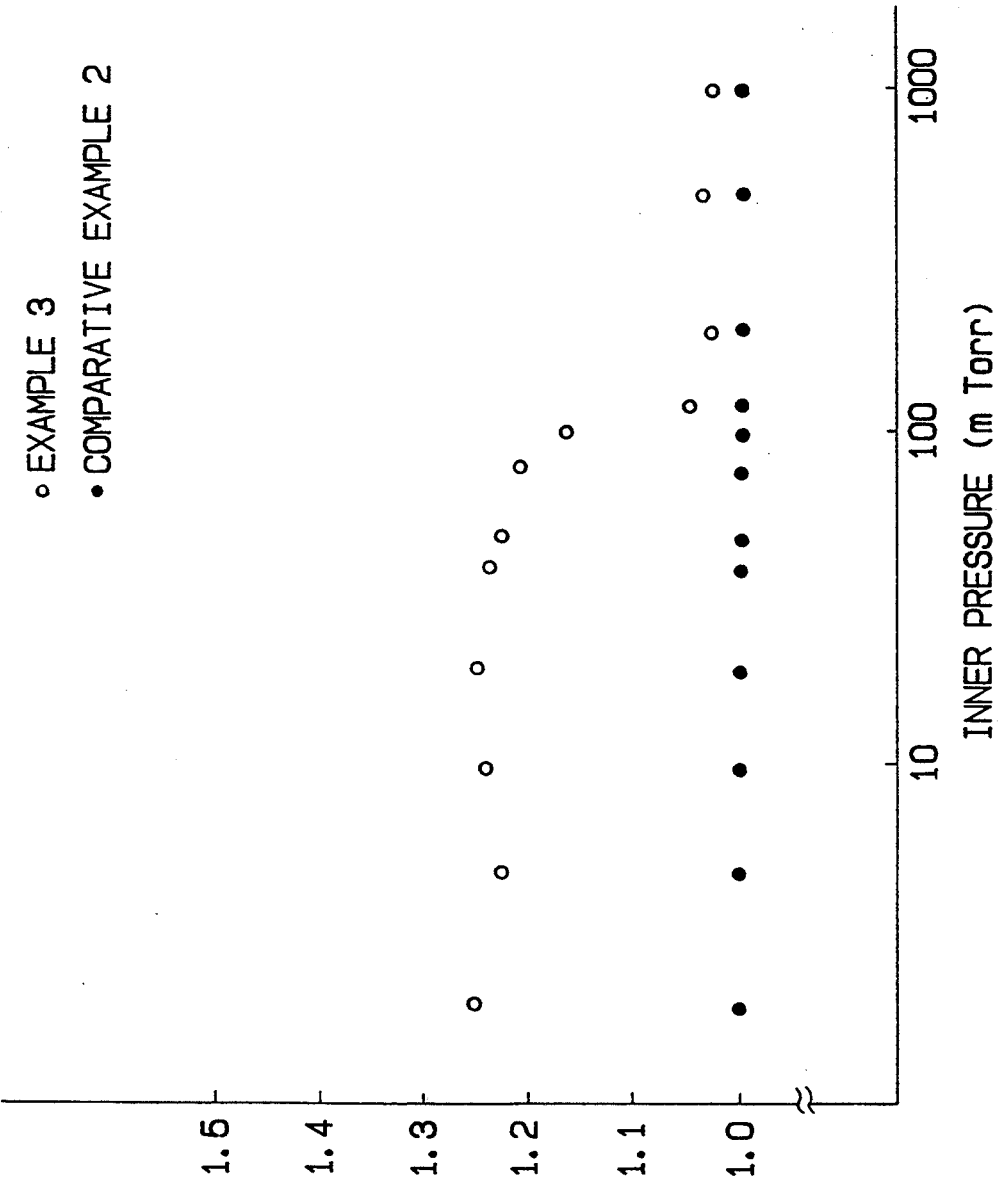

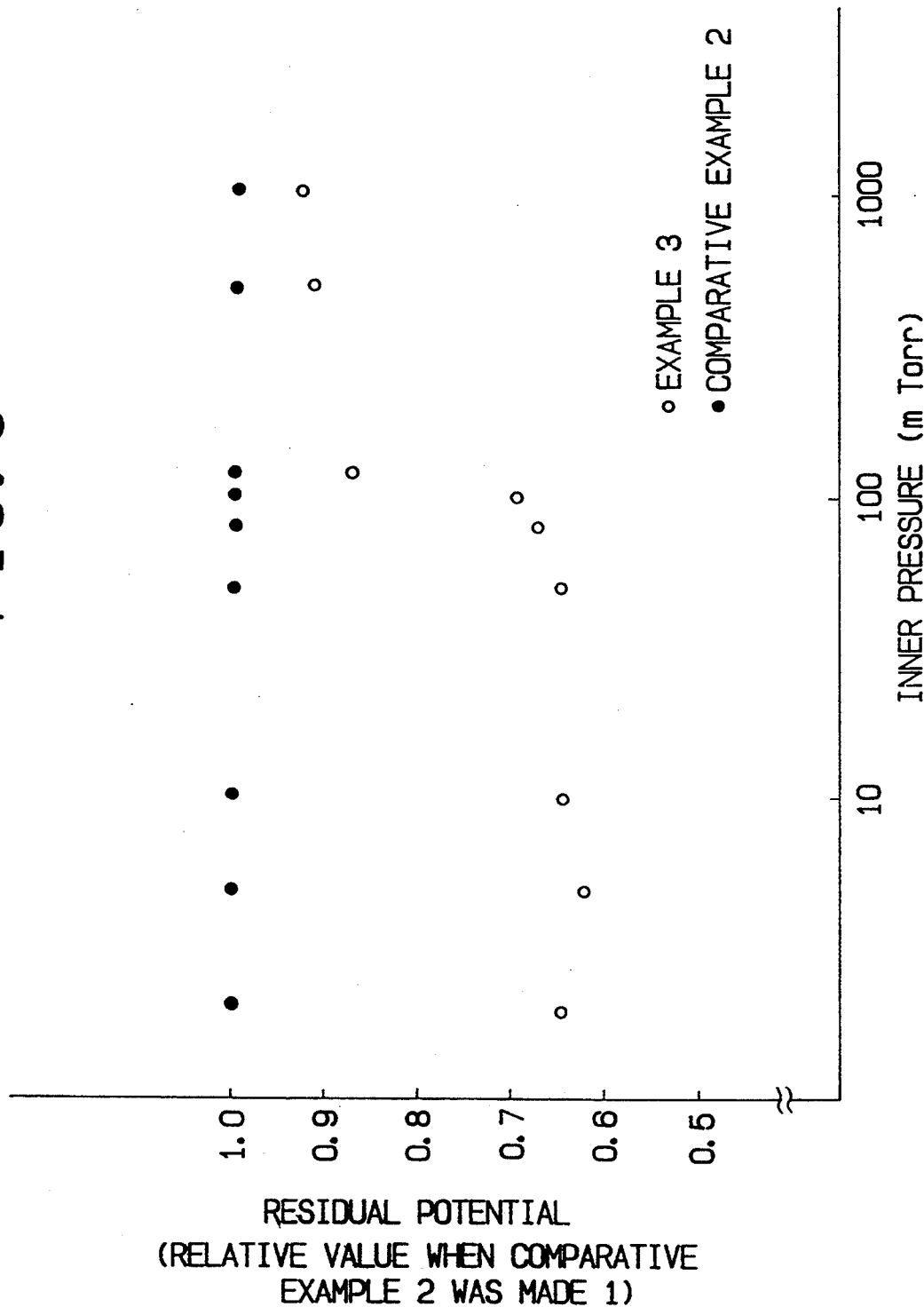

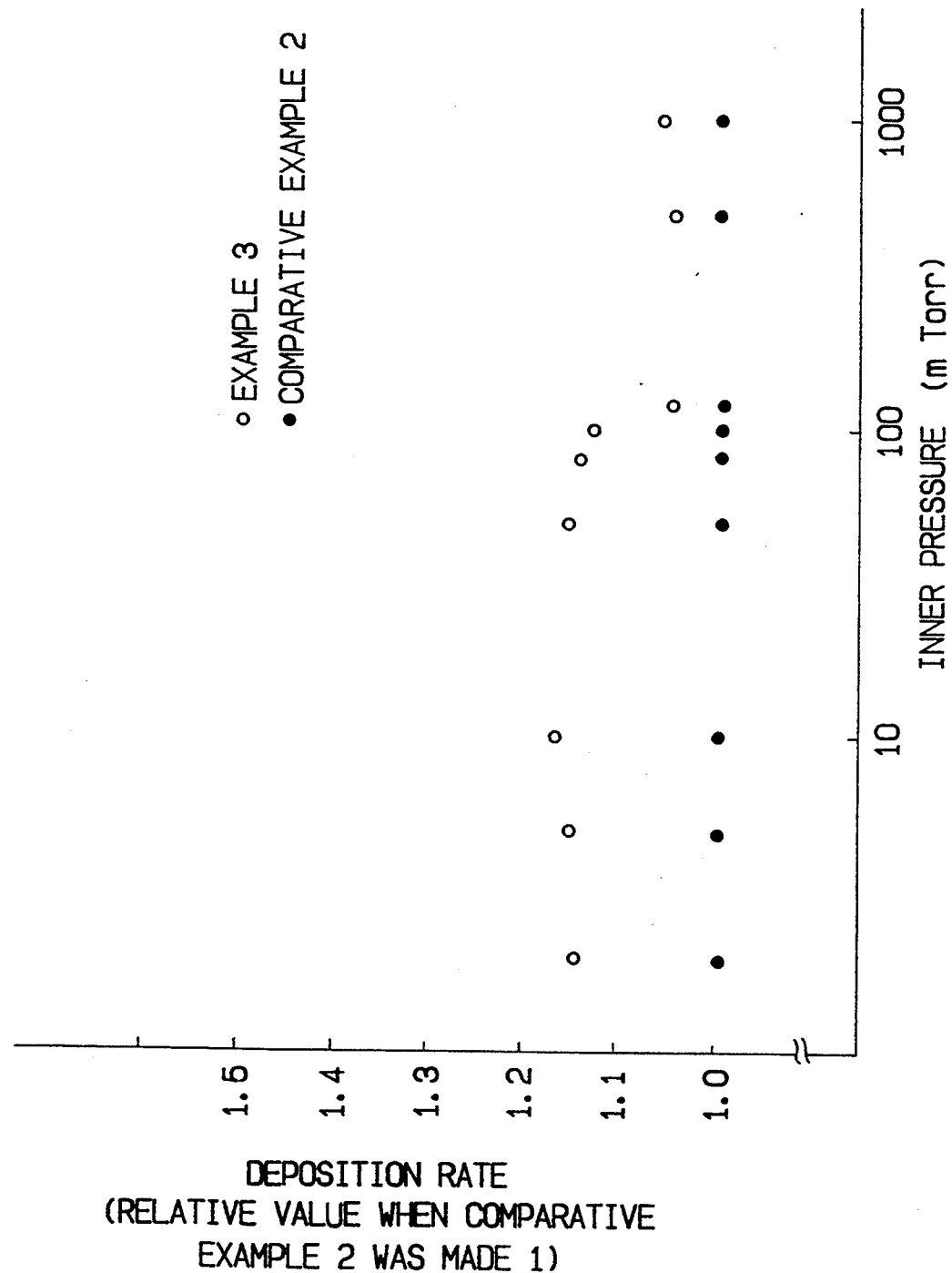

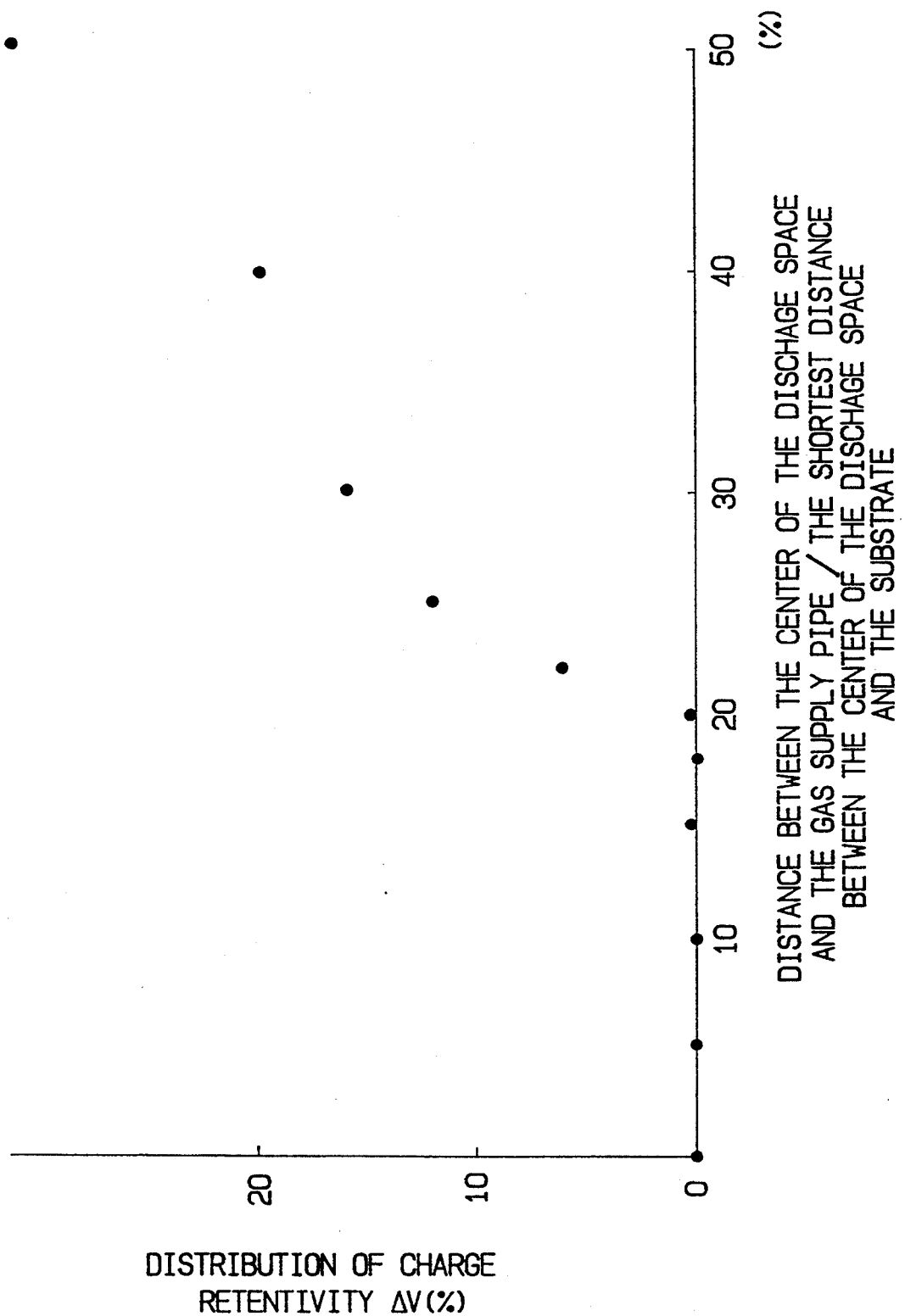

METHOD OF PREPARATION OF FUNCTIONAL DEPOSITED FILM BY MICROWAVE PLASMA CHEMICAL VAPOR DEPOSITION

This application is a continuation of application Ser. No. 07/707,297 filed May 29, 1991, now abandoned, which is a continuation of application Ser. No. 07/435,178 filed Nov. 13, 1989, now abandoned.

FIELD OF THE INVENTION

This invention relates to a method for the formation of a functional non-single-crystal deposited film such as an amorphous silicon film on a substrate by means of microwave plasma chemical vapor deposition (hereinafter referred to simply as "MW-PCVD"), the deposited film being usable as a photoconductive member for semiconductor devices, photosensitive devices for use in electrophotography, image input line sensors, image pickup devices, photoelectromotive force devices or the like. The invention also relates to an apparatus suitable for practicing said method.

BACKGROUND OF THE INVENTION

Heretofore, as the constituent element members of semiconductor devices, photosensitive devices for use in electrophotography, image input line sensors, image pickup devices or other optical devices, there have been proposed a number of amorphous semiconductor films, for instance, an amorphous deposited film composed of an amorphous silicon material compensated with hydrogen atoms (H) or/and halogen atoms (X) such as fluorine atoms or chlorine atoms (hereinafter referred to as "a-Si(H,X)"). Some of such films have been put into practical use.

Along with those amorphous semiconductor films, there have been proposed various methods for their preparation using plasma chemical vapor deposition technique wherein a raw material gas is decomposed by subjecting it to the action of an energy of direct current, high frequency or microwave glow discharge thereby to form a deposited film on a substrate of glass, quartz, heat-resistant resin, stainless steel or aluminum. And there have also been proposed various apparatus for practicing such methods.

Recently, public attention has been focused on the plasma chemical vapor deposition method by means of microwave glow discharge decomposition (hereinafter abbreviated as "MW-PCVD method") industrial level.

One representative apparatus for practicing such MW-PCVD method is such that has a construction as shown in a schematic perspective view of FIG. 2.

The MW-PCVD apparatus shown in FIG. 2 comprises a substantially enclosed reaction chamber 201 (film-forming chamber) having a microwave introducing window 201 which is hermetically provided with the reaction chamber. The microwave introducing window 202 is formed of a dielectric material such as quartz, glass, alumina ceramics, or the like. Numeral reference 203 stands for a metal waveguide being connected to the microwave introducing window 202. The waveguide 203 is extending from a microwave power source (not shown) through a matching box and an isolator (not shown). The reaction chamber 201 is provided with a gas feed pipe 208 and an exhaust pipe 204 having one end opened into the reaction chamber 201 and the other end communicated with an exhaust device (not shown). The reaction chamber 201 has a discharge space formed by circumferential walls thereof. Numeral reference 307 stands for a substrate holder having a substrate 305, on which a film is to be deposited, being placed thereon.

In this conventional apparatus, a deposited film is formed in the manner as follows. The reaction chamber 201 is evacuated by the action of the exhaust device to thereby bring the inner pressure of the reaction chamber to a level of lower than $1 \times 10^{-7}$ Torr. Then, an electric heater (not shown) built in the substrate holder 205 is activated to heat the substrate 205 to a temperature suitable for forming a deposited film thereon and the substrate is maintained at this temperature. And in the case of forming an amorphous silicon deposited film, for example, a raw material gas such as silane gas ($SiH_4$) is introduced into the reaction chamber 201 through the gas feed pipe 208 at a predetermined flow rate. Concurrently, the microwave power source is switched on to generate microwave having a frequency of higher than 500 MHz, preferably, of 2.45 GHz, followed by introducing the microwave energy into the reaction chamber 201 through the waveguide 203 and the microwave introducing window 202, whereupon the raw material gas is excited with the action of the microwave energy and dissociated to cause the formation of a deposited film on the surface of the substrate 205 in the discharge space 206 of the reaction chamber 201.

The apparatus shown in FIG. 2 makes it possible to form a deposited film as described as long as the substrate is of flat or almost flat shape. However, it is difficult for the apparatus to form a deposited film, for example, on a cylindrical substrate for a photosensitive member to be used in electrophotography.

There has been proposed an apparatus for forming a deposited film on a cylindrical substrate, as shown in FIG. 3, which is designed to manufacture an electrophotographic photosensitive drum.

More specifically, the film-forming apparatus shown in FIG. 3 has a substantially enclosed reaction chamber (film-forming chamber) 301 comprising a circumferential wall having an end portion thereof hermetically provided with a microwave introducing window 302 to which a waveguide 303 extending from a microwave power source (not shown) is connected. The reaction chamber 301 has a plasma generation space (discharge space in other words) 306 circumscribed by a plurality of rotatable cylindrical substrate holders each having a cylindrical substrate 305 being positioned thereon. Each of the substrate holders is provided with an electric heater 307 for adjusting the temperature of the substrate 305 positioned thereon. The reaction chamber 301 is provided with an exhaust means 304 being connected through an exhaust valve (not shown) to an exhaust device (not shown). Numeral reference 308 stands for gas feed means which serves to supply a raw material gas into the discharge space 306. The gas feed means 308 is provided behind each pair of cylindrical substrates 305 so as to supply a raw material gas through the space between the two cylindrical substrates 305 into the discharge space 306. Each of the gas feed means 308 is connected through a conduit 308' to a reservoir (not shown).

The film-forming apparatus shown in FIG. 3 operates substantially in the same manner as the apparatus shown in FIG. 2, except that the cylindrical substrates are rotated during the film-forming process in order to form a desired deposited film on each of the cylindrical substrates 305.

The film-forming apparatus shown in FIG. 3 makes it possible to mass-produce photosensitive drums having practically applicable electrophotographic properties which can be used in electrophotographic image-forming process. But those photosensitive drums prepared by the film-forming apparatus shown in FIG. 3 are apt to cause various problems upon use in the image-forming process in that images as copied become undesirably thin in density, accompanied with fogginesses, poor in contrast or the like, particularly when the electrophotographic image-forming process is carried out under high humidity charging or low humidity developing, or when there are differences in the functions of developers used, or when these situations take place together.

In addition to the above, there are problems for the film-forming apparatus shown in FIG. 3 because the gas feed means 308 situated behind and close to the cylindrical substrates 305, dusts or foreign matters present on or around the gas feed means are blown up to get in the discharge space 306 upon supplying a raw material gas, whereby those dusts or foreign matters are contaminated into the deposited films formed on the cylindrical substrates 305. If this happens, the resultant photosensitive drums become uneven in the electrophotographic properties.

SUMMARY OF THE INVENTION

The present invention is aimed at overcoming the foregoing problems of the conventional MW-PCVD film forming method and the conventional MW-PCVD film-forming apparatus. Another object of the present invention is to make an improvement in the said method and apparatus so as to enhance the utilization efficiency of a raw material gas and to uniformly form desirable deposited films on cylindrical substrates in a stabilized manner and at a high deposition rate, which are usable as the constituent elements in semiconductor devices, electrophotographic photosensitive devices, image input line sensors, image pickup devices, photoelectromotive force devices or various other electronic or optical devices.

The present inventors have conducted extensive studies in order to solve the foregoing problems which are found on the conventional MW-PCVD film forming method and the conventional MW-PCVD film-forming apparatus and to attain the foregoing object, and as a result, have arrive at a solution with regard to the manner of introducing a raw material gas in the conventional MW-PCVD film forming apparatus shown in FIG. 3 where the raw material gas is introduced into the discharge space through the spaces between the adjacent cylindrical substrates. Then, the present inventors have conducted a number of experiments. As a result, it has been discovered that part of the raw material gas as supplied often reaches a substrate before being sufficiently decomposed by plasma or flows out of the discharge space without contributing to the formation of a deposited film.

It has also been found that there exist in the vicinity of the gas feed means 308 radicals and ions which are caused as a result of insufficient decomposition of the raw material gas with plasma or which are not sufficiently excited and these precursors of low energy level eventually contribute to the formation of a deposited film. Because of this, the resulting deposited film becomes such that there is a large internal stress and is inferior in the characteristics or uneven in the characteristics.

In view of the above, the present inventors have tried to longitudinally install a gas feed pipe provided with a plurality of gas liberation holes capable of radiately supplying a raw material gas against the cylindrical substrates 305 at the center of the discharge space 306 in stead of the gas feed means 308 in the MW-PCVD film-forming apparatus shown in FIG. 3.

As a result, it has been found that it is possible to stably and uniformly form a desirable deposited film excelling in the characteristics on each of the cylindrical substrate 305.

The present invention has been accomplished on the above finding, and it includes an improved MW-PCVD film-forming process and an improved MW-PCVD apparatus suitable for practicing said process.

One aspect of the present invention is to provide an improved MW-PCVD film-forming process to be practiced in an apparatus comprising a film-forming chamber provided with means for introducing microwave energy into said chamber, means for evacuating the inside of said chamber and means for supplying a raw material gas into said chamber, said chamber containing a plurality of rotatable cylindrical substrate holders each having a substrate (for example, of cylindrical form) positioned thereon, said plurality of cylindrical substrate holders being concentrically arranged to circumscribe a discharge space (plasma generation space), said process comprises radiately supplying a raw material gas against the cylindrical substrate holders through a gas feed pipe provided with a plurality of gas liberation holes capable of supplying the raw material gas radiately against and in parallel with the substrate holders which is longitudinally installed substantially at the center position of the discharge space while rotating the cylindrical substrate holders and concurrently applying microwave energy through the microwave energy introducing means into the discharge space while maintaining the gaseous pressure of the discharge at a desired value and maintaining each of the substrates at a desired temperature to cause plasma discharge in the discharge space, whereby a deposited film is formed on each of the substrates. Another aspect of the present invention is to provide an improved MW-PCVD apparatus for forming a deposited film on a plurality of substrates (for example, of cylindrical form) which includes a film-forming chamber comprising a circumferential (outer) wall having an end portion thereof provided with a microwave introducing window to which a waveguide extending from a microwave power source is connected, said film-forming chamber having a discharge space (plasma generation space) circumscribed by a plurality of rotatable cylindrical substrate holders, each of said cylindrical substrate holders having one of said substrates thereon, said cylindrical substrate holders being concentrically arranged in said film-forming chamber, said film-forming chamber being provided with means for evacuating its inside and means for supplying a raw material gas into said discharge space, the improvement that said means for supplying the raw material gas comprises a gas feed pipe provided with a plurality of gas liberation holes capable of supplying a raw material gas radiately against and in parallel with each of said substrates which is installed substantially at the center position of said discharge space.

According to the present invention, there is provided a significant advantage that the raw material gas is effectively and sufficiently excited and decomposed with plasma before arriving at each of the substrate because of using the foregoing specific gas feed pipe. And because of this, the raw material gas effectively contributes to the formation of a deposited film with a high utilization efficiency irrespective of the film-forming conditions.

According to the present invention, there is provided a further advantage in that the raw material gas possesses an extremely high surface mobility upon arrival at the substrate because it is sufficiently decomposed with discharge plasma to form decomposed products which are followed by repeatedly colliding against electrons in the plasma to cause precursors of a high energy level. Because of this, a desirable deposited film of high quality which is not accompanied with negative internal stress is obtained.

According to the present invention, there is provided a still further advantage that the foregoing problems caused by dusts or foreign matters present in the vicinity of the gas feed means which are found in the foregoing prior art are desirably eliminated because the gas feed pipe is sufficiently apart from the substrates in the present invention.

Further, the present invention makes it possible to stably mass-produce desirable photosensitive drums which provide excellent copied images even upon repeated use under reverse electrophotographic image-forming conditions.

BRIEF DESCRIPTION OF THE DRAWINGS

FIG. 1(A) is a schematic vertical sectional view of the MW-PCVD film forming apparatus according to the invention.

FIG. 4 shows graphs illustrating the interrelations between the charge retentivity and the inner pressure with respect to the electrophotographic photosensitive drums prepared in Example 3 and Comparative Example 2, which will be described hereinafter.

FIG. 5 shown graphs illustrating the interrelations between the residual potential and the inner pressure with respect to the foregoing electrophotographic photosensitive drums.

FIG. 6 shows graphs illustrating the interrelations between the deposition rate and the inner pressure with respect to the foregoing electrophotographic photosensitive drums.

FIG. 7 shows graphs illustrating the interrelations between the electrophotographic characteristics and the position where the gas feed pipe is situated with respect to the electrophotographic drums prepared in Example 4, which will be described hereinafter.

DESCRIPTION OF THE PREFERRED EMBODIMENTS

The above-mentioned MW-PCVD film forming method of the present invention can be practiced by the use of a relevant MW-PCVD apparatus.

Figure 1B:
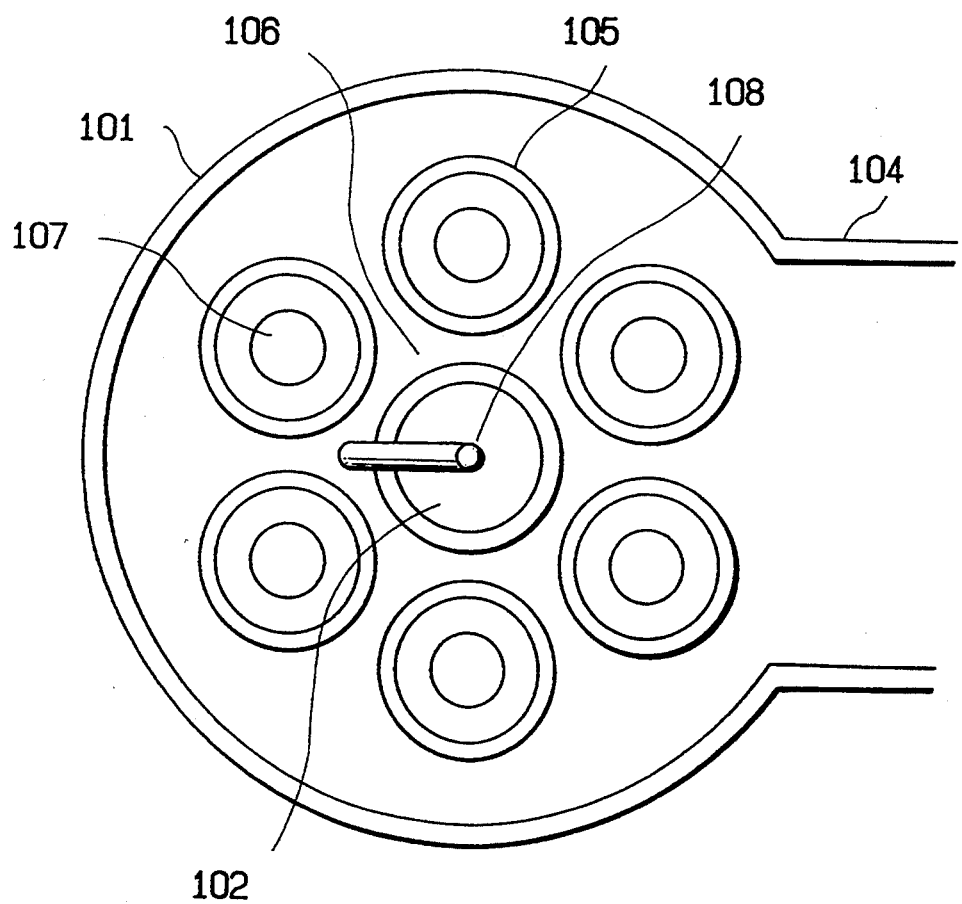
FIG. 1(B) is a schematic horizontal sectional view taken along the X—X line of the MW-PCVD film forming apparatus shown in FIG. 1(A).
Figure 2:
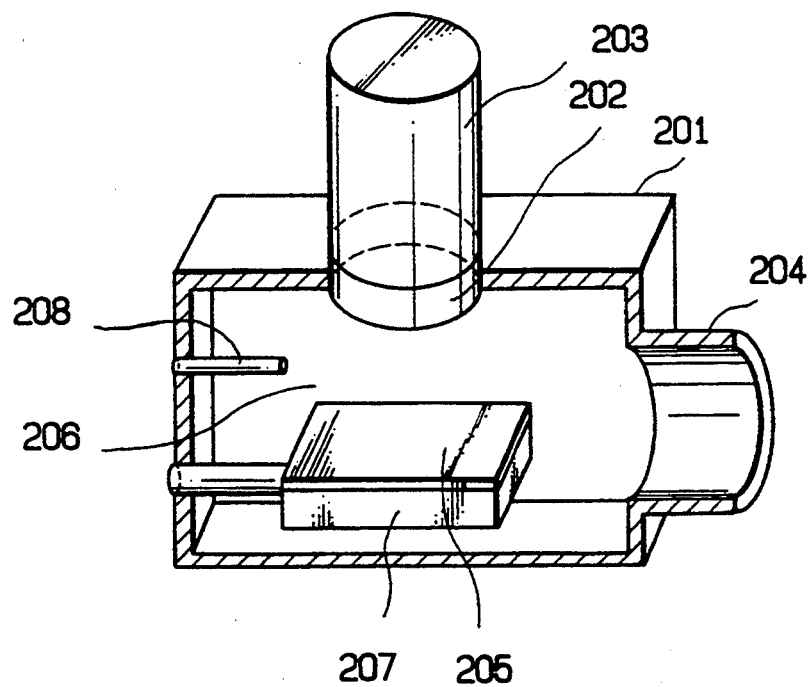
FIG. 2 is a partly cutaway perspective view of a conventional MW-PCVD film forming apparatus.

FIGS. 1(A) and 1(B) show the constitution of a representative MW-PCVD apparatus suitable for practicing the method of the invention.

In FIGS. 1(A) and 1(B), numeral reference 101 stands for a substantially enclosed film-forming chamber. In a preferred embodiment, the film-forming chamber 101 is cylindrically shaped as shown in FIGS. 1(A) and 1(B). The film-forming chamber 101 comprises a circumferential (outer) wall having an end portion thereof hermetically provided with a microwave introducing window 102 to which a waveguide 103 extending through a matching box of automatic mechanism and the like (not shown) from a microwave power source (not shown).

The microwave introducing window 102 is formed of a dielectric material such as quartz glass which is capable of efficiently transmitting microwave as well as maintaining vacuum tightness. The waveguide 103 is formed of a metal. Numeral reference 104 stands for an exhaust pipe which is open into the film-forming chamber 101. The exhaust pipe 104 is connected through an exhaust valve (not shown) to an exhaust device (not shown).

Numeral reference 105 stands for a cylindrical substrate positioned on a rotatable cylindrical substrate holder having an electric heater 107 serving to adjust the temperature of said substrate which is supported by a rotary shaft 109 connected to a driving mechanism 110. Numeral reference 106 stands for a discharge space (plasma generation space) which is circumscribed by a plurality of the cylindrical substrate holders being concentrically arranged in the film-forming chamber 101.

Numeral reference 108 stands for a gas feed pipe provided with a plurality of gas liberation holes 108' capable of supplying a raw material gas radiately and uniformly against and in parallel with each of the cylindrical substrates 105 which is installed substantially at the center position of the discharge space 106. The gas feed pipe 108 is extended from a gas reservoir (not shown). The gas feed pipe 108 may be formed of a proper material selected from the group consisting of metals such as Al, Cr, Mo, Au, In, Nb, Te, V, Ti, Pt, Pd and Fe; and Alloys of these metals. In alternative, the gas feed pipe 108 may also be formed of a synthetic resin such as polycarbonate, glass or ceramics. In a most preferred embodiment, the gas feed pipe 108 is formed of a material by which microwave energy is hardly absorbed, such as alumina ceramics or quartz glass.

There is not any particular restriction with regard to the shape of the gas feed pipe 108. However, it is most desired to be of a cylindrical shape with a cross-sectional diameter preferably in the range of 1% to 30%, and more preferably in the range of 3% to 20% of the apparent diameter of the discharge space 106.

Also, there is not any particular restriction with regard to the length of the gas feed pipe 108. However, it is desired to have a length equivalent to that of the cylindrical substrate, and more preferably have a length of several millimeters longer than that of the cylindrical substrate.

As for the gas liberation holes 108' of the gas feed pipe 108, they are desired to be so arranged on the gas feed pipe so that the raw material gas is effectively released radiately in a number of directions toward the cylindrical substrate holders in the discharge space 106. In a preferred embodiment, a plurality of gas liberation holes 108' are arranged on the gas feed pipe 108 such that the raw material gas is released radiately and uniformly against all the cylindrical substrate holders and is dispersed uniformly in the entire discharge space 106. Each of the gas liberation holes 108' may be a nozzle or orifice. As for the size of each of said plurality of gas liberation holes to be provided with the gas feed pipe, when it is excessively small, the hole will be often filled with a material during film formation to cause unevenness for the raw material gas to be dispersed, and on the other hand, when it is excessively large, it will be impossible to provide a desired difference between the gaseous pressure in the gas feed pipe and the gaseous pressure in the discharge space and because of this, a desirable deposited film having an uniform thickness can not be formed. In view of this, said size is made to be preferably in the range of 0.4 to 2.5 mm$^2$ and more preferably in the range of 0.6 to 1.5 mm$^2$. And the gas feed pipe is desired to be provided with a plurality of such gas liberation holes with a density of 0.1 to 2 holes/cm$^2$ in all the directions in order to secure the uniform thickness of a deposited film to be obtained.

In the alternative, the gas liberation holes 108' may be formed of a porous material capable of releasing gas into the discharge space 106.

In the present invention, the gas feed pipe 108 is desired to be longitudinally installed substantially at the center position of the discharge space 106 apparently in a cylindrical form in the film-forming chamber 101. However, in practice, it is possible to be longitudinally installed at any position of the discharge space 106 in the film-forming chamber 101 as long as the position where the gas feed pipe 108 is longitudinally installed is in a range of less than 20% of the shortest distance between the apparent center of the discharge space 106 and the cylindrical substrate holder 105.

In the present invention, the number of the gas feed pipe 108 is not always limited to one. In some circumstances, two or more of the foregoing gas feed pipes may be used. However, in that case, it is necessary for those gas feed pipes to be appropriately arranged in the discharge space 106 such that plasma discharge is effectively caused. The upper limit for the number of the gas feed pipes to be able to be installed in the discharge space 106 is 20. However, in the case where 10 or less of the gas feed pipes are used plasma discharge can be effectively caused as desired without having a specific consideration for the arrangements not only of the gas feed pipes to be installed in the discharge space but also of the cylindrical substrate holders, etc.

In the following, the MW-PCVD film-forming method using the foregoing MW-PCVD apparatus shown in FIGS. 1(A) and 1(B) will be explained.

Firstly, a plurality of cylindrical substrates 105 are placed on the corresponding cylindrical substrate holders. Then, all the cylindrical substrates are rotated and the film-forming chamber is evacuated by the exhaust device to bring the inside to a predetermined vacuum. Each of the cylindrical substrates 105 is heated by actuating the heater 107 to a temperature in the range of 50° to 400° C. and it is maintained at this temperature. Thereafter, a raw material gas such as silane gas (SiH$_4$) is introduced through the gas liberation holes 108' of the gas feed pipe 108 into the discharge space 106 at a predetermined flow rate, followed by adjusting the gaseous pressure of the discharge space 106 to be in the range of $10^{-2}$ to $10^{-4}$ Torr by regulating the exhaust valve. Concurrently, the microwave power source is switched on to generate microwave with a frequency of more than 500 MHz (preferably, 2.45 GHz), and the microwave energy is applied through the waveguide 103 and the microwave introducing window 102 into the discharge space 106 to thereby cause plasma discharge in the discharge space 106, whereby a deposited film is formed on each of said plurality of cylindrical substrates 105.

In the present invention, more pronounced effects are obtained when the gaseous pressure of the discharge space 106 during the film-forming process is adjusted to be less than 100 mm Torr, preferably less than 50 mm Torr.

Now, there are found various disadvantages in the case of the foregoing conventional MW-PCVD film-forming apparatus that the residence time of the raw material gas is unavoidably shortened because the raw material gas is introduced through the spaces between the adjacent cylindrical substrates into the discharge space; part of the raw material gas is apt to arrive at the surface of the cylindrical substrate without being decomposed with plasma and this makes the quality of the resulting film to be reduced; and the amount of the raw material gas to be exhausted without contributing to the formation of a deposited film is significant.

On the other hand, in the case of the present invention, such disadvantages are effectively eliminated and there are provided unexpected advantages that the raw material gas is effectively contributed to the formation of a deposited film with an improved gas utilization efficiency and a desirable deposited film of high quality is formed on each of the cylindrical substrates. Specifically in this respect, it is considered that the raw material gas is supplied at the center of the discharge space where the electron density is high and because of this, the raw material gas is effectively decomposed to generate precursors capable of causing the formation of a deposited film; and there is little occasion for the precursors to be collided with undecomposed raw material gas molecules. Because of this, chemical reactions between said two kinds of materials hardly occur in the vapor phase and thus, the precursors of high energy level produced as a result of sufficient decomposition of the raw material gas effectively contribute to the formation of a deposited film on each of the cylindrical substrates.

As the film-forming raw material gas to be used for forming an amorphous silicon deposited film in the present invention, there can be mentioned, for example, silane (SiH$_4$), disilane (Si$_2$H$_6$) and the like. In the present invention, it is possible to form other amorphous deposited film, for example, by using a proper film-forming gas such as germane (GeH$_4$) and the like.

In any case, the film-forming raw material gas may be diluted with a dilution gas such as H$_2$, Ar, or He.

Further, in order to vary the band gap of a deposited film to be formed, there can be used a nitrogen atom-containing gas such as N$_2$ and NH$_3$, an oxygen atom-containing gas such as O$_2$, NO or NO$_2$, or a hydrocarbon such as CH$_4$, C$_2$H$_6$, C$_2$H$_4$, C$_2$H$_2$, or C$_3$H$_8$. Other than these, it is possible to use a fluoride such as SiF$_4$, Si$_2$F$_6$, or GeF$_4$. These gases may be used alone or in combination.

In the present invention, a dopant gas such as diborane (B$_2$H$_6$), phosphine (PH$_3$) or the like can be effectively introduced into the discharge space for doping purposes concurrently with the raw material gas.

Examples of the material which can be used as the substrate in the present invention include metals such as stainless steel, Al, Cr, Mo, Au, In, Nb, Te, V, Ti, Pt, Pd, Fe and the like, alloys of these metals, and synthetic resins like polycarbonate, and glass, ceramics or paper with a suitable surface treated to have an electrical conductivity.

In the present invention, as the cylindrical substrate, one which has a diameter of more than 10 mm is effective. The optimum diameter is in the range of 20 mm to 500 mm. There is not any particular restriction with regard to the length of the substrate. However, it is preferred to be in the range of 50 mm to 1000 mm from a practical point of view.

As for the space to be provided between the adjacent cylindrical substrates in the film-forming chamber in the present invention, it is preferably in the range of 1 mm to 60 mm, and more preferably, in the range of 3 mm to 40 mm. Especially in the case where it is made to be more than 7 mm, the effects of the invention can be augmented by a combined use of a discharge stabilizing agent such as Ar gas or $SiF_4$ gas.

Practically, the individual cylindrical substrates are positioned with a spacing of 5 mm to 20 mm in consideration of the demands for the easiness of positioning the substrates and compactness of the apparatus.

As for the substrate temperature at the time of forming a deposited film in the present invention, it is maintained at a temperature preferably in the range of 20° C. to 500° C., more preferably in the range of 50° C. to 450° C. In the foregoing explanation as for the microwave introducing means with reference to FIGS. 1(A) and 1(B), the case where the MW-PCVD apparatus has one microwave introducing window was explained, but it is possible for the MW-PCVD apparatus according to the present invention to be provided with a plurality of microwave introducing means.

As the means of introducing microwave into the discharge space in the present invention, it is possible to use a coaxial cable other than the foregoing microwave introducing means shown in FIG. 1(A). In this case, it is possible to provide one or more antennas in the film-forming chamber. And as for the microwave introducing window in this case, it is formed of a material which involves less microwave losses, including alumina, aluminum nitride, silicon nitride, silicon carbide, silicon oxide, beryllium oxide, teflon, polystyrene and the like.

The present invention is applicable to preparing not only photosensitive drums for electrophotographic copying machine but also other electronic devices to be used, for example, in printers, including blocking type amorphous silicon photosensitive members, high resistance type amorphous silicon photosensitive members.

The MW-PCVD film-forming method and the MW-PCVD apparatus of the present invention will be explained in more detail by the following examples which, however, are given for the purpose of illustration and should not be construed as limitative of the present invention.

EXAMPLE 1 AND COMPARATIVE EXAMPLE 1

(Example 1)

A plurality of electrophotographic photosensitive drums each having a light receiving layer comprising a charge injection inhibition layer, a photoconductive layer and a surface layer being laminated in this order on a cylindrical substrate were prepared by the use of the MW-PCVD apparatus shown in FIGS. 1(A) and 1(B) which is equipped with a film-forming chamber 101 of 540 mm in internal diameter and a gas feed pipe 108 made of a pure nickel which is of 12 mm in diameter and which has a plurality of 1 mm diameter gas liberation holes (nozzles) with a density of 16 holes per $cm^2$ over a length of 320 mm in all directions toward the cylindrical substrate holders.

As the substrate, there was used a cylindrical aluminum substrate of 180 mm in outer diameter and 5 mm in thickness.

On each of the cylindrical substrate holders in the foregoing MW-PCVD apparatus, said cylindrical substrate was placed. Then, the film-forming chamber was evacuated to bring the inside to a vacuum of about $2 \times 10^{-6}$ Torr. Successively, all the cylindrical substrate holders started rotating. Then, all the cylindrical substrates were heated to about 250° C. and they were maintained at this temperature. Thereafter, the film-forming process was carried out under the conditions shown in Table 1.

In this way, there were obtained the foregoing electrophotographic photosensitive drums.

(Comparative Example 1)

Figure 3:
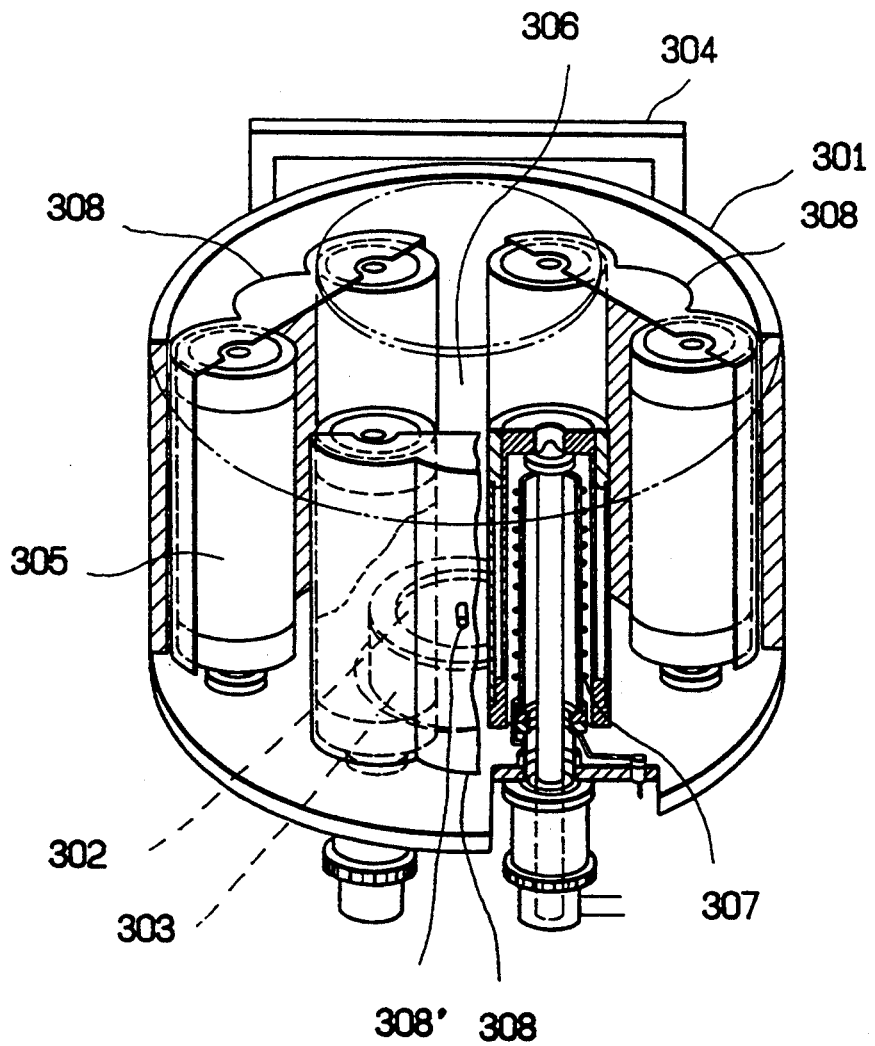
FIG. 3 is a schematic perspective view of another conventional MW-PCVD film forming apparatus.

Separately, a plurality of electrophotographic photosensitive drums were prepared by the use of the conventional MW-PCVD apparatus shown in FIG. 3 similarly under the conditions shown in Table 1.

In both of Example 1 and Comparative Example 1, the time required for depositing a photoconductive layer of 25 microns was measured.

Each of the thus-obtained photosensitive drums in Example 1 and Comparative Example 1 was evaluated by using a commercially available Cannon copy machine NP-7550 which had been modified for evaluation of a photosensitive drum with respect to the following items.

(A) Defective images: a solid black image was formed on an A3 paper sheet, and defects of white dots of larger than 0.3 mm in diameter were counted. The number of the defects was expressed in terms of a relative value of 1 representing the number of image defects in Comparative Example 1.

(B) Charge retentivity: after charging under 800 μA corona current, the surface potential of a developed portion without exposure was measured and expressed in terms of a relative value of 1 representing the surface potential in Comparative Example 1.

(C) Residual potential: after charging under 800 μA corona current, the drum was exposed to light of 1.8 lux.sec and the surface potential of a developed portion was measured and expressed in terms of a relative value of 1 representing the surface potential in Comparative Example 1.

In Table 2, there were shown the results of the evaluation, along with the deposition rate of a 25 μm thick photoconductive layer, expressed as the film thickness (25 μm) divided by the time required for obtaining a deposited film of that thickness and in terms of a relative value of 1 representing the deposition rate in Comparative Example 1. From the results shown in Table 2, it is understood that drastic improvements in the film characteristics and film deposition rate can be attained by the present invention.

This is presumed due to the fact that before reaching the substrates, the raw material gas is excited and decomposed sufficiently, to increase the rate of existence of precursors and the surface mobility of gas molecules on the substrates, whereby deposited films of satisfactory properties including low internal stress are formed.

Further, it is considered that the marked improvement of the deposition rate or the gas utilization efficiency implies an extremely small probability of the raw material gas to be exhausted without contributing to the film formation.

EXAMPLE 2

The procedures of Example 1 were repeated, except that the flow rate of SiH4 at the time of forming the photoconductive layer was varied, to thereby obtain a plurality of electrophotographic photosensitive drums. The resultant photosensitive drums were evaluated in the same manner as in Example 1.

The evaluation results were as shown in Table 3. From the results shown in Table 3, it is understood that satisfactory results can be constantly obtained in the case of the present invention even though the flow rate of the raw material gas is varied. It is also understood that the improvement in the gas utilization efficiency becomes more conspicuous when the flow rate of the raw material gas is increased in the present invention.

EXAMPLE 3 AND COMPARATIVE EXAMPLE 2

(Example 3)

A plurality of electrophotographic photosensitive drums were prepared by using the same MW-PCVD apparatus as used in Example 1 and under the same conditions and by the same procedures as in Example 1, except that the gaseous pressure of the discharge space at the time of forming the photoconductive layer was varied.

(Comparative Example 2)

Separately, a plurality of electrophotographic photosensitive drums were prepared by using the same conventional MW-PCVD apparatus as used in Comparative Example 1 and under the same conditions and by the same procedures as in Comparative Example 1, except that the gaseous pressure of the discharge space at the time of forming the photoconductive layer was varied.

Each of the thus-obtained photosensitive drums was evaluated in the same manner as in Example 1 to evaluate the charge retentivity and residual potential. The value of evaluation was shown as a relative value of 1 representing the value in Comparative Example 2. In FIGS. 4 and 5, there were shown the interrelations between the gaseous pressure of the discharge space and the charge retentivity of the resultant drum, and the interrelations between the gaseous pressure of the discharge space and the residual potential of the resultant drum, respectively.

And at the time of forming the photoconductive layers in Example 3 and Comparative Example 2, the time required for forming a 25 μm thick photoconductive layer was measured for evaluation of the deposition rate. The deposition rate was expressed as a relative value of 1 representing the deposition rate in Comparative Example 2. In FIG. 6, there were shown the interrelations between the gaseous pressure of the discharge space and the deposition rate.

From the results shown in FIGS. 4 through 6, it is understood that the present invention is particularly effective when the gaseous pressure of the discharge space at the time of discharge is made to be lower than 100 mTorr.

EXAMPLE 4

A plurality of electrophotographic photosensitive drums were prepared by using the same MW-PCVD apparatus as used in Example 1 under the same conditions and by the same procedures as in Example 1, except that the position of the gas feed pipe was changed variously. The thus-obtained photosensitive drums were evaluated in the same manner as in Example 1 to evaluate the charge retentivity of the resultant drum. Wherein, the resultant six photosensitive drums for each batch were evaluated to determine the irregularity in the charge retentivity (expressed by percentage (%) to a mean value of the difference between the maximum and minimum values) with regard to the respective film-forming conditions. The results were as shown in FIG. 7.

In FIG. 7, the horizontal axis represents the rate (%) of the distance between the center of the discharge space and the center of the gas feed pipe to the shortest distance between the center of the discharge space and the substrate, while the vertical axis represents the afore-mentioned irregularity (%) in charge retentivity. From the results shown in FIG. 7, it is understood that the effects of the present invention become more pronounced when the gas feed pipe is located within the range of less than 20% of the shortest distance between the center of the discharge space and the cylindrical substrate.

It will be appreciated from the foregoing description that, according to the present invention which introduce the raw material gas substantially from the center of the discharge space, deposited films of satisfactory characteristics can be formed in any regions of the film-forming chamber.

Besides, according to the present invention, desirable deposited films can be formed uniformly at a high deposition rate and with a high raw material gas utilization efficiency.

Further, the present invention can achieve a marked improvement in the charge retentivity and a drastic reduction in the residual potential especially in the case of an electrophotographic photosensitive drum having an amorphous silicon light receiving layer.

TABLE 1

| Film-forming conditions | | charge injection inhibition layer | photoconductive layer | surface layer |
|---|---|---|---|---|
| gas used and its flow rate | SiH4 (sccm) | 500 | 800 | 200 |
| | B2H6 (ppm) (against SiH4) | 2000 | 5 | 0 |
| | NO (sccm) | 20 | 0 | 0 |
| | CH4 (sccm) | 0 | 0 | 1000 |
| inner pressure (mTorr) | | 1.3 | 1.8 | 3 |
| microwave power (W) | | 700 | 1500 | 1000 |
| frequency of microwave (GHz) | | 2.45 | 2.45 | 2.45 |
| layer thickness (μm) | | 3 | 25 | 0.5 |

TABLE 2

| | defective image | charge retentivity | residual potential | deposition rate* |
|---|---|---|---|---|
| Example 1 | 0.50 | 1.25 | 0.65 | 1.15 |
| Comparative Example 1 | 1 | 1 | 1 | 1 |

*The deposition rate was obtained by measuring the period of time required to form the photoconductive layer of 25 μm in thickness and dividing the thickness of 25 μm by the measured period of time. And the values mentioned in the column of Example 1 are relative values obtained when the values obtained in Comparative Example 1 were made the value of 1.

TABLE 3

| flow rate of SiH4 upon forming the photoconductive layer (sccm) | defective image | charge retentivity | residual potential | deposition rate |
| --- | --- | --- | --- | --- |
| Example 2 | | | | |
| 300 | 0.35 | 1.35 | 0.60 | 1.10 |
| 500 | 0.45 | 1.25 | 0.65 | 1.15 |
| 1200 | 0.60 | 1.30 | 0.70 | 1.25 |
| 1500 | 0.55 | 1.20 | 0.65 | 1.35 |
| Comparative Example 1 | 1 | 1 | 1 | 1 |

What we claim is:

1. A microwave plasma chemical vapor deposition process for forming a functional deposited film on each of a plurality of cylindrical substrates by means of a microwave plasma chemical vapor deposition conducted in a substantially enclosed film-forming chamber, said film-forming chamber comprising an outer wall having an end portion thereof hermetically provided with a microwave introducing window to which a waveguide extending from a microwave power source is connected, said film-forming chamber having a substantially cylindrical discharge space encircled by surfaces of said cylindrical substrates, each of said cylindrical substrates being supported by a substrate working means, said film-forming chamber being provided with means for evacuating the inside of said film-forming chamber, said process comprising:

(a) longitudinally disposing a gas feed pipe provided with a plurality of gas liberation holes at the center position of said discharge space such that said gas feed pipe is arranged substantially parallel to said cylindrical substrates and at a position situated in the range of 20% or less of the shortest distance between the apparent center of said discharge space and the substrate surfaces;

(b) radially supplying against the substrate surfaces a raw material gas through said plurality of gas liberation holes of said gas feed pipe while moving the surface of each of said cylindrical substrates by said substrate working means;

(c) maintaining the gaseous pressure of said discharge space at a value of 100 mTorr or less; and (d) applying into said discharge space microwave energy through said microwave introducing window to cause microwave glow discharge in said discharge space, whereby said functional deposited film is formed on the surface of each of said cylindrical substrates.

2. The process according to claim 1, wherein said gas feed pipe is a cylindrical gas feed pipe.

3. The process according to claim 2, wherein said cylindrical gas feed pipe has a cross sectional diameter corresponding to 1 to 30% of the apparent cross sectional diameter of said discharge space.

4. The process according to claim 1, wherein said plurality of gas liberation holes on said gas feed pipe are present with a density of 0.1 to 2 holes/cm$^2$ in all directions toward said surface of substrate.

5. The process according to claim 1, wherein said gas feed pipe comprises a plurality of cylindrical gas feed pipes each being provided with gas liberation holes, each of said cylindrical gas feed pipes having a cross sectional diameter corresponding to 1 to 30% of the apparent cross sectional diameter of said discharge space.

6. The process according to claim 5, wherein said plurality of gas liberation holes on each of said plurality of gas feed pipes are present with a density of 0.1 to 2 holes/cm$^2$ in all directions toward said surface of substrate.

* * * * *

UNITED STATES PATENT AND TRADEMARK OFFICE
CERTIFICATE OF CORRECTION

PATENT NO. : 5,338,580
DATED : August 16, 1994
INVENTOR(S) : HIROYUKI KATAGIRI, ET AL.

It is certified that error appears in the above-identified patent and that said Letters Patent is hereby corrected as shown below:

COLUMN 1

Line 49, "method")" should read --method") at the--.

COLUMN 4

Line 30, "radiately" should read --radially--.
Line 34, "radiately" should read --radially--.

COLUMN 5

Line 47, "shown" should read --shows--.

COLUMN 6

Line 32, "radiately" should read --radially--.

COLUMN 9

Line 68, "16 holes" should read --1.6 holes--.

COLUMN 14

Line 19, "cross sectional" should read --cross-sectional--.
Line 20, "cross sec-" should read --cross-sec- --.
Line 29, "cross" should read --cross- --.

UNITED STATES PATENT AND TRADEMARK OFFICE
CERTIFICATE OF CORRECTION

PATENT NO. : 5,338,580
DATED : August 16, 1994
INVENTOR(S) : HIROYUKI KATAGIRI, ET AL.

Page 2 of 2

It is certified that error appears in the above-identified patent and that said Letters Patent is hereby corrected as shown below:

<u>COLUMN 14</u>

Line 31, "cross sectional" should read --cross-sectional--.

Signed and Sealed this

Eleventh Day of June, 1996

Attest:

BRUCE LEHMAN

Attesting Officer

Commissioner of Patents and Trademarks